United States Patent [19]
Orban

[11] Patent Number: 5,574,791
[45] Date of Patent: Nov. 12, 1996

[54] COMBINED DE-ESSER AND HIGH-FREQUENCY ENHANCER USING SINGLE PAIR OF LEVEL DETECTORS

[75] Inventor: Robert A. Orban, Belmont, Calif.

[73] Assignee: AKG Acoustics, Incorporated, San Leandro, Calif.

[21] Appl. No.: 260,106

[22] Filed: Jun. 15, 1994

[51] Int. Cl.⁶ .................................................. H03G 5/00
[52] U.S. Cl. .......................... 381/98; 381/104; 381/106; 381/107; 381/94
[58] Field of Search ................................ 381/106, 107, 381/108, 104, 98, 110, 94g4; 333/14, 13

[56] References Cited

U.S. PATENT DOCUMENTS

| | | | |
|---|---|---|---|
| 3,846,719 | 11/1974 | Dolby | 381/94 |
| 4,363,006 | 12/1982 | Ishigaki et al. | 381/94 |
| 4,947,133 | 8/1990 | Thomas | 381/107 |
| 5,050,217 | 9/1991 | Orban | 381/94 |
| 5,371,803 | 12/1994 | Williamson, III | 381/104 |

FOREIGN PATENT DOCUMENTS 1157953  11/1983  Canada ................................. 381/107

*Primary Examiner*—Forester W. Isen
*Assistant Examiner*—Duc Nguyen
*Attorney, Agent, or Firm*—Blakely, Sokoloff, Taylor & Zafman

[57] ABSTRACT

Two level detectors with logarithmic outputs receive an input audio signal. The first level detector receives the signal through a high-pass filter while the second level detector receives the signal through a band-pass filter contoured to simulate the equal-loudness curves of the human ear. The difference between the detectors' outputs (representing the log of the ratio of their respective input levels) is processed to provide quick broadband gain reduction whenever the ratio exceeds a preset threshold, providing de-essing. The difference is further smoothed and then applied to a voltage-controlled high-pass filter that provides high-frequency boost, the amount of which is controlled by the relative high frequency power contained within the input signal. This voltage-controlled high-pass filter applies automatic, program-adaptive equalization to the input signal.

5 Claims, 2 Drawing Sheets

DE-ESSER & HIGH-FREQUENCY ENHANCER

DE-ESSER & HIGH-FREQUENCY ENHANCER

NON-LINEAR TIMING 5,574,791

COMBINED DE-ESSER AND HIGH-FREQUENCY ENHANCER USING SINGLE PAIR OF LEVEL DETECTORS

BACKGROUND OF THE INVENTION

1. Field of the Invention

The present invention relates to the field of audio processing.

2. Prior Art

In the prior art there exist circuits for removing excessively strong sibilance from electrical signals representing the human voice, one example of which is the dbx Model 263X, manufactured by AKG Acoustics Inc. This device has two level detectors with logarithmic outputs to receive the input signal to be de-essed. The first level detector receives the signal through a third-order high-pass filter with a cutoff frequency of approximately 5 kHz, while the second level detector receives the signal through a band-pass filter contoured to simulate the equal-loudness curves of the human ear. The difference between the detectors' outputs (representing the log of the ratio of their respective input levels) is summed with a reference DC voltage to preset the threshold of de-essing. This sum is applied to a thresholding circuit that detects an "ess" by providing an output whenever the ratio between the high frequency and loudness-contoured powers in the input signal exceed the preset threshold level. The output of the thresholding circuit is applied to a voltage-controlled amplifier (VCA), which quickly and momentarily reduces the channel gain whenever an "ess" sound is detected.

There also exist circuits for performing program-adaptive equalization, such as that disclosed in my U.S. Pat. No. 5,050,217. In this enhancer circuit, a peak detector receives the input signal through a band-pass filter contoured to simulate the equal-loudness curves of the human ear. The input signal is also passed through a first-order high-pass filter to the input of a VCA. The output of the VCA is added to the original input signal to achieve high-frequency equalization. The output of the VCA is also passed through a second high-pass filter to one terminal of a comparator. The other terminal of the comparator receives the output of the peak detector. When the high-passed output of the VCA exceeds the output level of the peak detector, the comparator fires, charging a leaky integrator whose output is coupled to the gain-determining port of the VCA. The gain of the VCA decreases until the high-passed output of the VCA no longer exceeds the output level of the peak detector, at which point the comparator turns off. Thus feedback ensures that the output level of the VCA (representing high-frequency power to be added to the original signal to create the equalized output signal) is always a fixed ratio of the loudness-weighted peak level of the original signal.

SUMMARY OF THE INVENTION

The present invention combines a de-esser and high-frequency enhancer. Sharing a significant amount of circuitry between the two functions produces a more efficient and economical circuit.

The circuit of the present invention relies on a de-esser circuit like the one described above. It exploits the fact that the de-esser operates by processing the difference between the logarithmic outputs of the two level detectors, this difference being the log of the ratio between the high frequency power in the input signal and the loudness-weighted total power in the input signal. For high frequency enhancing, a non-linear low-pass filter smoothes the log ratio signal to remove small level variations. The smoothed log ratio signal is then applied to the gain control terminal of a VCA. This VCA receives the input signal after de-essing and after passing through a high-pass filter. The gain of the VCA is proportional to the exponential of the signal at its control terminal; thus, the gain (in dB) of the VCA is proportional to the signal at its control terminal. This characteristic is commonly called "decilinear." The VCA's gain is thus proportional to the ratio between the high frequency power in the input signal and the loudness-weighted total power in the input signal, which is very similar to the results achieved from the high frequency enhancer circuit described in U.S. Pat. No. 5,050,217. However, the high frequency enhancer circuit of the present invention operates in feed-forward mode (not feedback), and does not require a peak detector, comparator, or leaky integrator. It is therefore considerably more economical than the circuit described in U.S. Pat. No. 5,050,217, since it uses most of the de-esser's control circuitry.

DETAILED DESCRIPTION OF THE INVENTION

A combined de-esser circuit and high frequency enhancer circuit is described. In the following description, numerous specific details are set forth, such as specific circuit components, to provide a thorough understanding of the present invention. It will be obvious to one skilled in the art that the present invention can be practiced without these specific details. In other instances, well-known circuits are set forth in block diagram form in order not to unnecessarily obscure the present invention.

Figure 1:
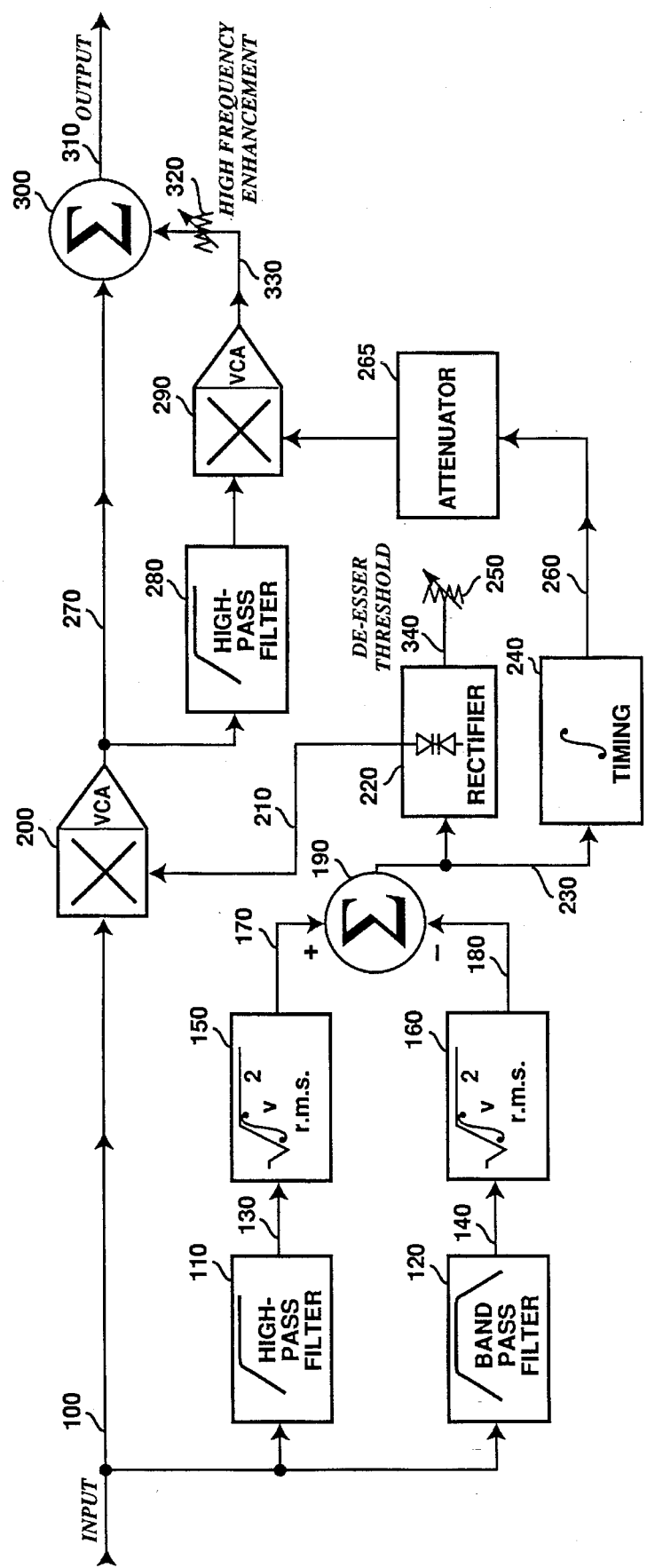
FIG. 1 is a block diagram of the present invention.

Referring to FIG. 1, the circuit receives a signal to be de-essed and enhanced on line 100. The signal on line 100 is applied through high-pass filter 110 to a first r.m.s. (root-mean-square) level detector 150, and through band-pass filter 120 to second r.m.s. detector 160. The shape of the band-pass filter 120 approximates the equal-loudness sensitivity of the human ear at a level of 70 phon. (R.M.S. detectors' outputs are proportional to the exponentially-weighted average power at their inputs.) Both r.m.s. detectors can be type uPC1253H2, manufactured by THAT Corporation.

Differencing means 190 receives the outputs of r.m.s. detectors 150 and 160 on lines 170 and 180, respectively, and applies the difference signal (line 190) to rectifier 220 and timing circuit 240. Circuit 240 is a non-linear low-pass filter that has a very long time constant for signals with small envelope variations and a much shorter time constant for signals with larger envelope variations.

De-esser threshold control 250 generates a DC reference offset on line 340. This signal is summed with the rectified signal on line 190 in rectifier 220. This DC offset determines the signal level that will first cause the output of rectifier 220 to produce an output on line 210. The gain-control input of VCA 200 is coupled to line 210. The signal on line 210 is constant unless the level on line 190 exceeds the threshold level set by de-esser threshold control 250. If the level on line 190 exceeds this threshold level, the signal on line 210 changes to produce gain reduction in VCA 200. This gain reduction causes a reduction in the level of "ess" sounds.

The appropriate attack and release times for the de-essing function are quite fast (attack≈1 millisecond and release≈30 milliseconds). These time constants are determined by the time constants of the level detectors 150 and 160. However, the best-sounding time constants for the high-frequency enhancement function are much slower. Further, the high-frequency enhancement function sounds best when it causes no obvious modulation of the channel frequency response. This implies that the control signal deciding the amount of high-frequency enhancement must be very well smoothed, and must not respond to very small changes in the relative high frequency power content of the input signal. Timing circuit 240 performs this smoothing function.

Figure 2:
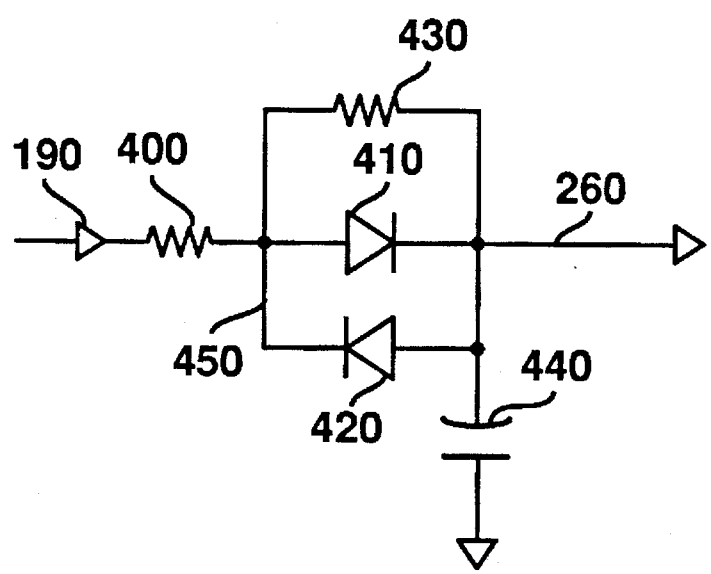
FIG. 2 is an electrical schematic of the non-linear timing circuit of FIG. 1.

Referring to FIG. 2, resistor 400 receives the input signal to be smoothed (from line 190). Resistor 400 is connected to a parallel combination of two diodes 410 and 420, and resistor 430. The far side of this parallel combination drives capacitor 440. In the preferred embodiment, resistor 400 is 330 kΩ, resistor 430 is 22 MΩ, capacitor 440 is 47 nanofarads, and diodes 410 and 420 are IN4148.

If the variation in the envelope of the signal on line 190 is small, capacitor 440 charges slowly through the series combination of resistors 400 and 430 because the diodes' turn-on threshold (approximately 600 mV) is not exceeded. If the variation in the envelope of the signal on line 190 is large enough to turn on the diodes, then capacitor 440 charges much more quickly, with a rate set mainly by resistor 400. Because the current vs. voltage characteristic of the diodes is, in fact, approximately exponential, the switch between slow and fast time constants occurs smoothly as the variation in the envelope of the signal on line 260 increases.

Referring to FIG. 1, the control terminal of VCA 290 receives the output of timing circuit 240 on line 260. VCA 290 receives the output of VCA 200 through high-pass filter 280. In the preferred embodiment, filter 280 is a 6 dB/octave high-pass filter with a corner frequency of approximately 4 kHz.

In the preferred embodiment, the sensitivity of the gain-control terminal of VCA 290 is approximately one-third that of VCA 200. Thus a large signal level change on line 230 causes the gain of VCA 290 (in dB) to change about one-third as much as the gain of VCA 200. Because, in a practical implementation, VCA 200 and 290 are the same type (the preferred type is uPC1252H2, manufactured by THAT Corp.), an attenuator 265 is placed in line 260 to effect the sensitivity change.

High-frequency enhancement control 320 receives the output of VCA 290 and lets the operator decide how much of the output of VCA 290 is mixed with the unenhanced signal on line 270 in summer 300, thus setting the amount of enhancement to the operator's taste. The amount of high-frequency enhancement can alternately be set with a DC-operated control by summing an operator-controlled DC voltage with the signal on line 260 before its application to VCA 290's gain control port. This works because summation in the log domain is equivalent to multiplication, so the DC voltage would simply offset the gain of VCA 290 by a given number of decibels. This is equivalent to applying a gain control, such as on line 320, to the output line 330 of VCA 290.

Because the de-esser and high-frequency enhancer both operate feedforward, their order could easily be reversed. That is, VCA 200 could be inserted in line 310, with lines 100 and 270 connected together. Further, other types of detectors (such as averaging or peak detectors) could be substituted for r.m.s. detectors 150 and 160. The only requirement is that the outputs of these detectors must be proportional to the logarithm of the envelope of their inputs, regardless of the means used to measure the envelope.

Thus, a combination de-esser and high-frequency enhancer has been described. By exploiting conjoint circuitry, we obtain, by comparison with discrete functions known in the prior art, a simpler and less expensive system.

I claim:

1. In a de-essing circuit where two level detectors are used to provide a first signal representative of the logarithmic ratio between high frequency power in an input signal and the loudness-contoured power and where the signal is used with a DC level to control a first voltage controlled amplifier (VCA) to reduce sibilant sounds, an improvement to provide high frequency enhancement comprising:

a non-linear low-pass filter coupled to receive the first signal;

a second VCA controlled by an output signal from the non-linear low-pass filter;

a high pass filter coupled to receive the input signal, an output of the high pass filter being coupled to an input of the second VCA;

a combiner, coupled to receive the input signal and an output signal from the second VCA;

a control to control the amount of the input from the second VCA that is fed to the combiner; and, wherein the first and the second VCAs have the same gain characteristics and wherein an attenuator attenuates the output signal from the non-linear low pass filter before it controls the second VCA.

2. The improvement defined by claim 1 wherein the non-linear low pass filter comprises:

a parallel combination comprising a pair of diodes coupled in parallel with a first resistor;

a second resistor connecting one end of the parallel combination to receive the first signal; and a capacitor coupled to the other end of the parallel combination.

3. An apparatus for providing de-essing and high frequency enhancing of an input audio signal comprising:

a first circuit receiving the input audio signal for providing a first signal representative of the logarithmic ratio between high frequency power in the input audio signal and loudness-contoured power in the input audio signal;

a first voltage controlled amplifier (VCA) coupled to receive the audio input signal;

a de-esser threshold circuit for establishing a de-essing threshold voltage coupled to receive the first signal and for providing a second signal for controlling the first VCA;

a smoothing circuit coupled to receive the first signal for smoothing the first signal;

a high pass filter coupled to receive the input audio signal;

a second VCA coupled to be controlled by an output of the smoothing circuit and coupled to an output of the high pass filter; and, a combining circuit for combining the output of the second VCA with the output of the first VCA.

4. The apparatus defined by claim 3 wherein the first VCA and second VCA have the same gain characteristics.

5. The apparatus defined by claim 4 wherein the high pass filter receives the input audio signal at an output of the first VCA.

\* \* \* \* \*